(12) United States Patent
McKittrick et al.

(10) Patent No.: US 11,910,548 B2
(45) Date of Patent: Feb. 20, 2024

(54) FRAGMENTED COOLING KICKSTAND FOR INFORMATION HANDLING SYSTEMS (IHSS)

(71) Applicant: Dell Products, L.P., Round Rock, TX (US)

(72) Inventors: Allen B. McKittrick, Cedar Park, TX (US); Pomin Shih, Taipei (TW); Deeder M. Aurongzeb, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 17/653,728

(22) Filed: Mar. 7, 2022

(65) Prior Publication Data

US 2023/0284402 A1 Sep. 7, 2023

(51) Int. Cl.
*H05K 5/02* (2006.01)
*G06F 1/20* (2006.01)
*H05K 7/20* (2006.01)

(52) U.S. Cl.
CPC .......... *H05K 5/0213* (2013.01); *G06F 1/203* (2013.01); *H05K 7/20136* (2013.01)

(58) Field of Classification Search
CPC .............................. H05K 5/0213; G06F 1/203
See application file for complete search history.

(56) References Cited

U.S. PATENT DOCUMENTS

2019/0129480 A1* 5/2019 Ku ................... H05K 7/20509
2019/0278324 A1* 9/2019 Yoon .................... G06F 1/1616

* cited by examiner

*Primary Examiner* — Mukundbhai G Patel
(74) *Attorney, Agent, or Firm* — Fogarty LLP

(57) ABSTRACT

Embodiments of systems and methods for providing a fragmented cooling kickstand for Information Handling Systems (IHSs) are described. In some embodiments, an IHS may include a plurality of components and a housing configured to hold the plurality of components, where the housing includes a vent located under a kickstand when at least a portion of the kickstand is in a closed position.

18 Claims, 6 Drawing Sheets

FRAGMENTED COOLING KICKSTAND FOR INFORMATION HANDLING SYSTEMS (IHSS)

FIELD

This disclosure relates generally to Information Handling Systems (IHSs), and more specifically, to systems and methods for providing a fragmented cooling kickstand for IHSs.

BACKGROUND

As the value and use of information continues to increase, individuals and businesses seek additional ways to process and store it. One option available to users is an Information Handling System (IHS). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated.

Variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Portable IHSs may include laptops, tablets, smartphones, convertible devices (an IHS having separate housing portions coupled to each other via a hinge), etc. As the inventors hereof have recognized, a problem associated with portable IHSs is that heat dissipated by certain IHS components can increase the IHS's temperature above its thermal specifications.

SUMMARY

Embodiments of systems and methods for providing a fragmented cooling kickstand for Information Handling System (IHSs) are described. In an illustrative, non-limiting embodiment, an IHS may include a plurality of components and a housing configured to hold the plurality of components, where the housing includes a vent located under a kickstand when at least a portion of the kickstand is in a closed position. The housing may have a tablet, smartphone, or laptop form factor.

The vent may include a rectangular opening. A long side of the rectangular opening may be disposed parallel to an axis of rotation of the kickstand. Additionally, or alternatively, the long side of the rectangular opening may be disposed perpendicular to a lateral vent of the housing. Additionally, or alternatively, the vent may include a plurality of holes.

The kickstand may include an opening around the vent when the portion of the kickstand is in the closed position. The vent may be configured to increase air intake by a fan of the IHS when the portion of the kickstand is in an open position.

The housing may include a second vent located under the kickstand when the portion of the kickstand is in the closed position. The second vent may be configured to increase air intake by a second fan of the IHS when the portion of the kickstand is in the open position.

The housing may include a third vent configured to increase airflow through a center of the housing when the portion of the kickstand is in the open position. Additionally, or alternatively, the third vent may be configured to increase airflow around a heat pipe or heat sink of the IHS when the portion of the kickstand is in the open position.

In another illustrative, non-limiting embodiment, a housing may include a backplate having a vent configured to facilitate cooling of an IHS disposed in the housing, and a kickstand coupled to the backplate, where at least a portion of the kickstand is configured to cover the vent in a closed position and to uncover the vent in an open position. The vent may include one or more openings disposed parallel to a hinge coupled to the kickstand. The vent may be configured to provide additional air intake to a fan when the portion of the kickstand is in the open position. The kickstand may include one or more openings located around the vent when the portion of the kickstand is in the closed position.

In yet another illustrative, non-limiting embodiment, a method may include reducing airflow configured to cool an IHS component by closing at least a portion of a kickstand against a backplate of an IHS housing and increasing the airflow by opening the portion of the kickstand. In some cases, closing and opening the portion of the kickstand may include rotating the kickstand with respect to the backplate. The portion of the kickstand may be configured to cover a vent in the IHS housing when closed, and to uncover the vent when open. The portion of the kickstand may also be configured to cover another vent in the IHS housing when closed, and to uncover the other vent when open.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

For purposes of this disclosure, an Information Handling System (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An example of an IHS is described in more detail below. It should be appreciated that although certain embodiments are discussed in the context of a personal computing device, other embodiments may utilize various other types of IHSs.

Figure 1:
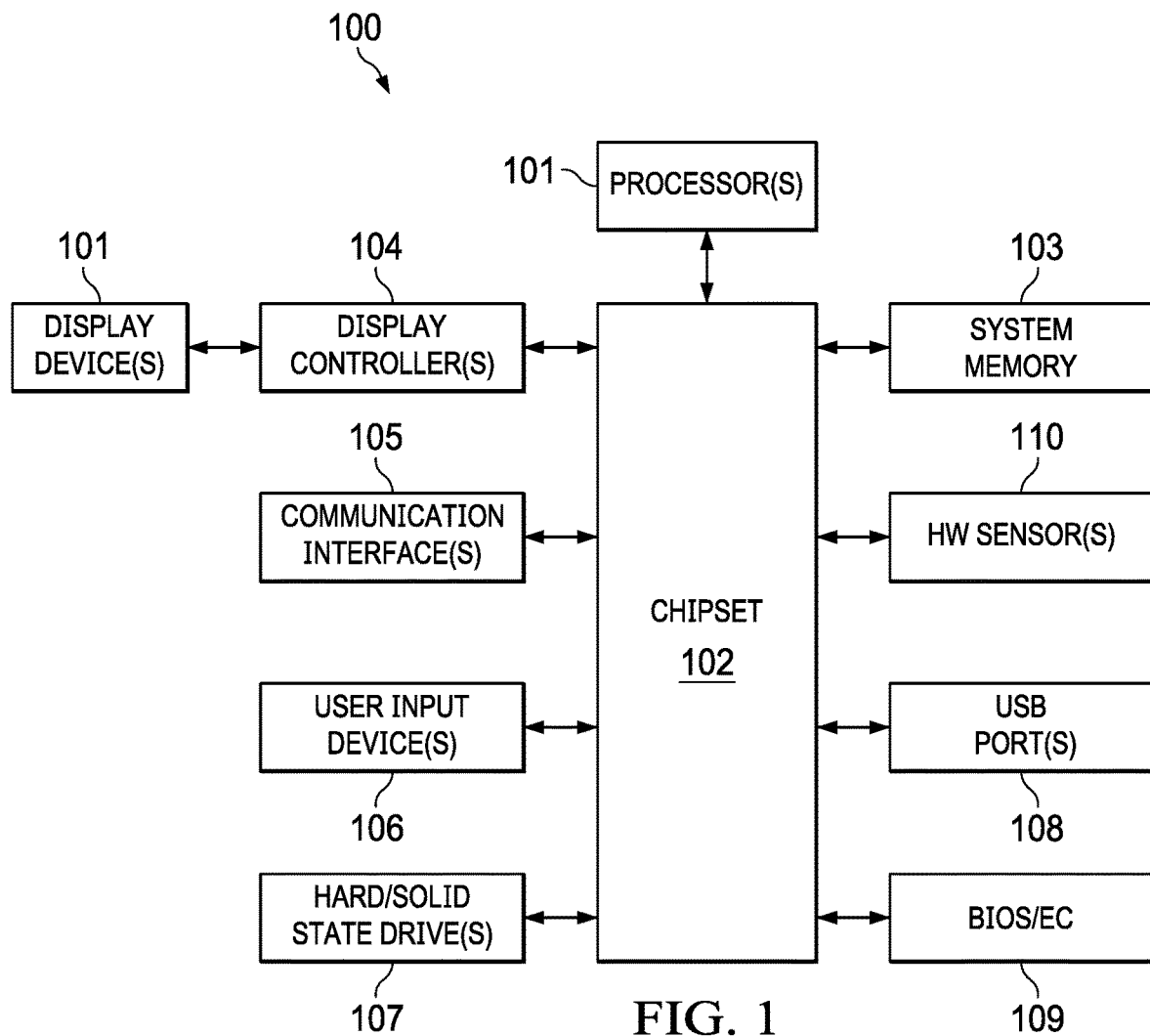
FIG. 1 is a diagram of an example of an Information Handling System (IHS), according to some embodiments.

FIG. 1 is a block diagram of components of IHS 100, according to some embodiments. As depicted, IHS 100 includes processor(s) 101. In various embodiments, IHS 100 may be a single-processor system, or a multi-processor system including two or more processors. Processor(s) 101 may include any processor capable of executing program instructions, such as a PENTIUM series processor, or any general-purpose or embedded processors implementing any of a variety of Instruction Set Architectures (ISAs), such as an x86 ISA or a Reduced Instruction Set Computer (RISC) ISA (e.g., POWERPC, ARM, SPARC, MIPS, etc.).

IHS 100 includes chipset 102 coupled to processor(s) 101. Chipset 102 (e.g., a Platform Controller Hub or "PCH," a Fusion Controller Hub or "FCH," etc.) may provide processor(s) 101 with access to several resources. In some cases, chipset 102 may utilize a QuickPath Interconnect (QPI) bus to communicate with processor(s) 101. Chipset 102 may also be coupled to communication interface(s) 105 to enable communications between IHS 100 and various wired and/or wireless networks, such as Ethernet, WiFi, BLUETOOTH, cellular or mobile networks (e.g., Code-division multiple access or "CDMA," Time-division multiple access or "TDMA," Long-Term Evolution or "LTE," 5G, etc.), satellite networks, or the like. In some cases, communication interface(s) 105 may be coupled to chipset 102 via a PCIe bus.

Chipset 102 may be coupled to display controller(s) 104, which may include one or more or Graphics Processor Unit(s) (GPUs) on a graphics bus, such as an Accelerated Graphics Port (AGP) or Peripheral Component Interconnect Express (PCIe) bus. As shown, display controller(s) 104 provide video or display signals to display device(s) 111. In some cases, display controller(s) 104 may also include a touchscreen controller that enables a user to provide touch inputs (e.g., finger, pen, etc.) directly on the surface of display device(s) 111. In other implementations, any number of display controller(s) 104 or display device(s) 111 may be used.

Display device(s) 111 may include Liquid Crystal Display (LCD), Light Emitting Diode (LED), organic LED (OLED), or other thin film display technologies. Display device(s) 111 may include a plurality of pixels arranged in a matrix, configured to display visual information, such as text, two-dimensional images, video, three-dimensional images, etc. In some cases, display device(s) 111 may be provided as a single continuous display, or as two or more discrete displays.

Chipset 102 may provide processor(s) 101 and/or display controller(s) 104 with access to system memory 103. In various embodiments, system memory 103 may be implemented using any suitable technology, such as static RAM (SRAM), dynamic RAM (DRAM) or magnetic disks, or any nonvolatile/Flash-type memory, such as a solid-state drive (SSD) or the like.

Chipset 102 may also provide access to one or more hard disk and/or solid-state drive(s) 107. In certain embodiments, chipset 102 may also provide access to one or more optical drives or other removable-media drives. In certain embodiments, chipset 102 may further provide access to one or more Universal Serial Bus (USB) port(s) 108.

Chipset 102 may be coupled to one or more user input device(s) 106, for example, via a super I/O controller or the like. Examples of user input device(s) 106 include, but are not limited to, a keyboard, mouse, touchpad, stylus or pen, totem, etc. Each of user input device(s) 106 may include a respective controller (e.g., a touchpad may have its own touchpad controller) that interfaces with chipset 102 through a wired or wireless connection (e.g., via communication interface(s) 105).

In certain embodiments, chipset 102 may also provide an interface for communications with one or more hardware sensor(s) 110. Sensor(s) 110 may be disposed on or within the housing of IHS 100, and may include, but are not limited to: electric, magnetic, Hall, radio, optical, photo, infrared, thermal, force, pressure, acoustic, ultrasonic, proximity, position, deformation, bending, direction, movement, velocity, rotation, and/or acceleration sensor(s).

Upon booting of IHS 100, processor(s) 101 may utilize Basic Input/Output System (BIOS) instructions of BIOS/Embedded Controller (EC) 109 to initialize and test hardware components coupled to IHS 100 and to load an OS for use by IHS 100. The BIOS provides an abstraction layer that allows the OS to interface with certain hardware components that are utilized by IHS 100. Via the hardware abstraction layer provided by the BIOS, software stored in system memory 103 and executed by processor(s) 101 can interface with certain I/O devices that are coupled to IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

EC 109 may be installed as a Trusted Execution Environment (TEE) component to the motherboard of IHS 100. EC 109 may implement operations for interfacing with a power adapter in managing power for IHS 100. Such operations may be utilized to determine the power status of IHS 100, such as whether IHS 100 is operating from battery power or is plugged into an AC power source. Firmware instructions utilized by EC 109 may be used to provide various core operations of IHS 100, such as power management and management of certain modes of IHS 100 (e.g., turbo modes, maximum operating clock frequencies of certain components, etc.).

EC 109 may also implement operations for detecting certain changes to the physical configuration or posture of IHS 100. For instance, where IHS 100 as a 2-in-1 laptop/tablet form factor, EC 109 may receive inputs from a lid position or hinge angle sensor (e.g., sensor(s) 110), and it may use those inputs to determine: whether the two sides of IHS 100 have been latched together to a closed position or a tablet position, the magnitude of a hinge or lid angle, etc.

In other embodiments, IHS 100 may not include all the components shown in FIG. 1. In other embodiments, IHS 100 may include other components in addition to those that are shown in FIG. 1. Furthermore, some components that are represented as separate components in FIG. 1 may instead be integrated with other components. For example, all or a portion of the operations executed by the illustrated components may instead be provided by components integrated into processor(s) 101 as a System-On-a-Chip (SoC). In certain embodiments, IHS 100 may be implemented as different types of portable IHSs including, but not limited to: laptops, tablets, smartphones, convertible devices (e.g., dual display IHSs), video game consoles, etc.

Figure 2:
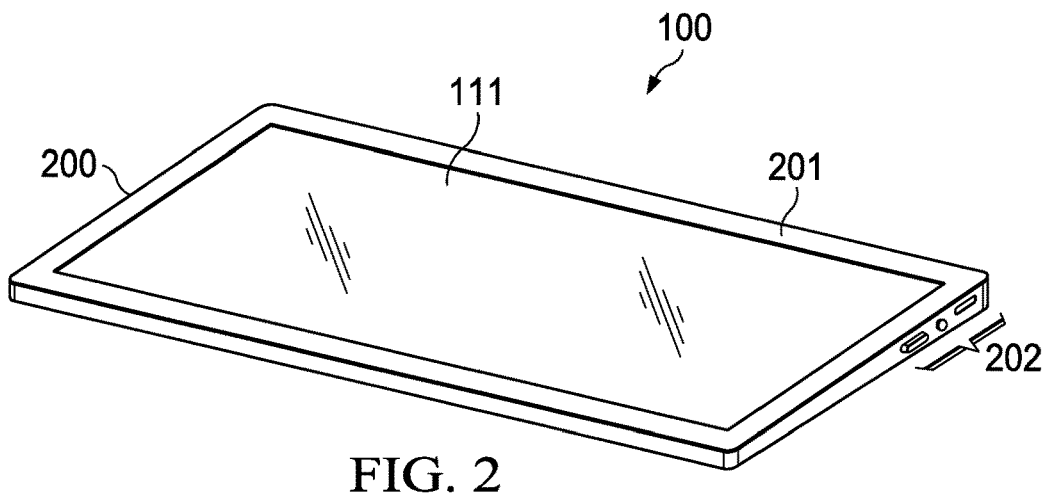
FIG. 2 is a diagram of an example of a portable IHS, according to some embodiments.

FIG. 2 is a diagram of an example of portable housing 200 for IHS 100 (e.g., a tablet device). The bottom surface of housing 200 rests on a planar surface, such as a tabletop, to provide a user with touchscreen display 111 with which to interact. In this example, housing 200 includes one or more openings 202 for power buttons, volume controls, audio/video jacks or ports, a charging port, etc. Housing 200 also includes bezel, edge, frame, or border 201 around at least a portion of its perimeter. In various implementations, housing 200 may generally be made of a metal or metallic alloy or material (e.g., magnesium, aluminum, etc.), at least in part, due to its heat conduction and RF shielding properties.

Figure 3:
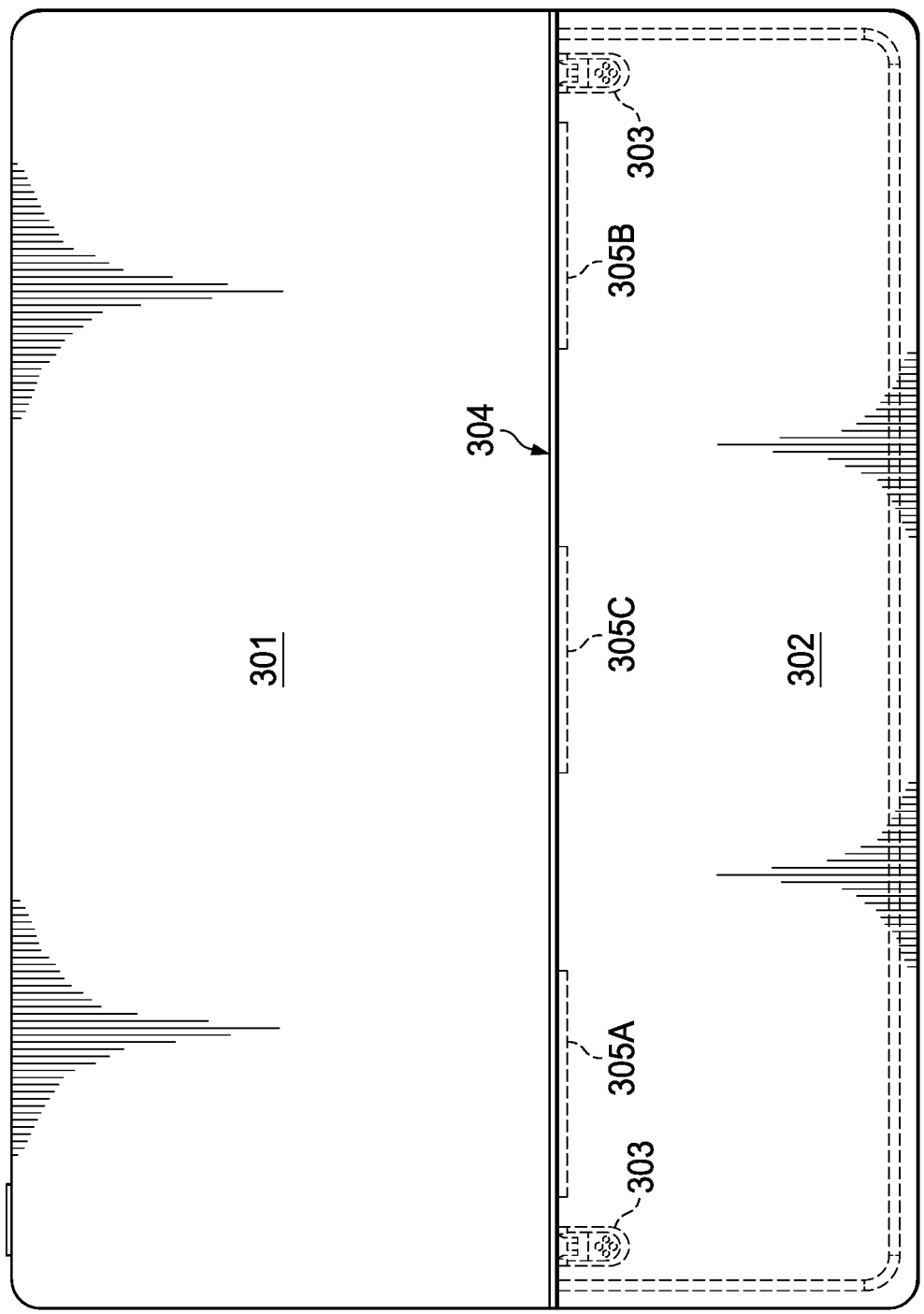
FIG. 3 is a diagram of an example of a housing with a kickstand in a closed position, according to some embodiments.
Figure 4:
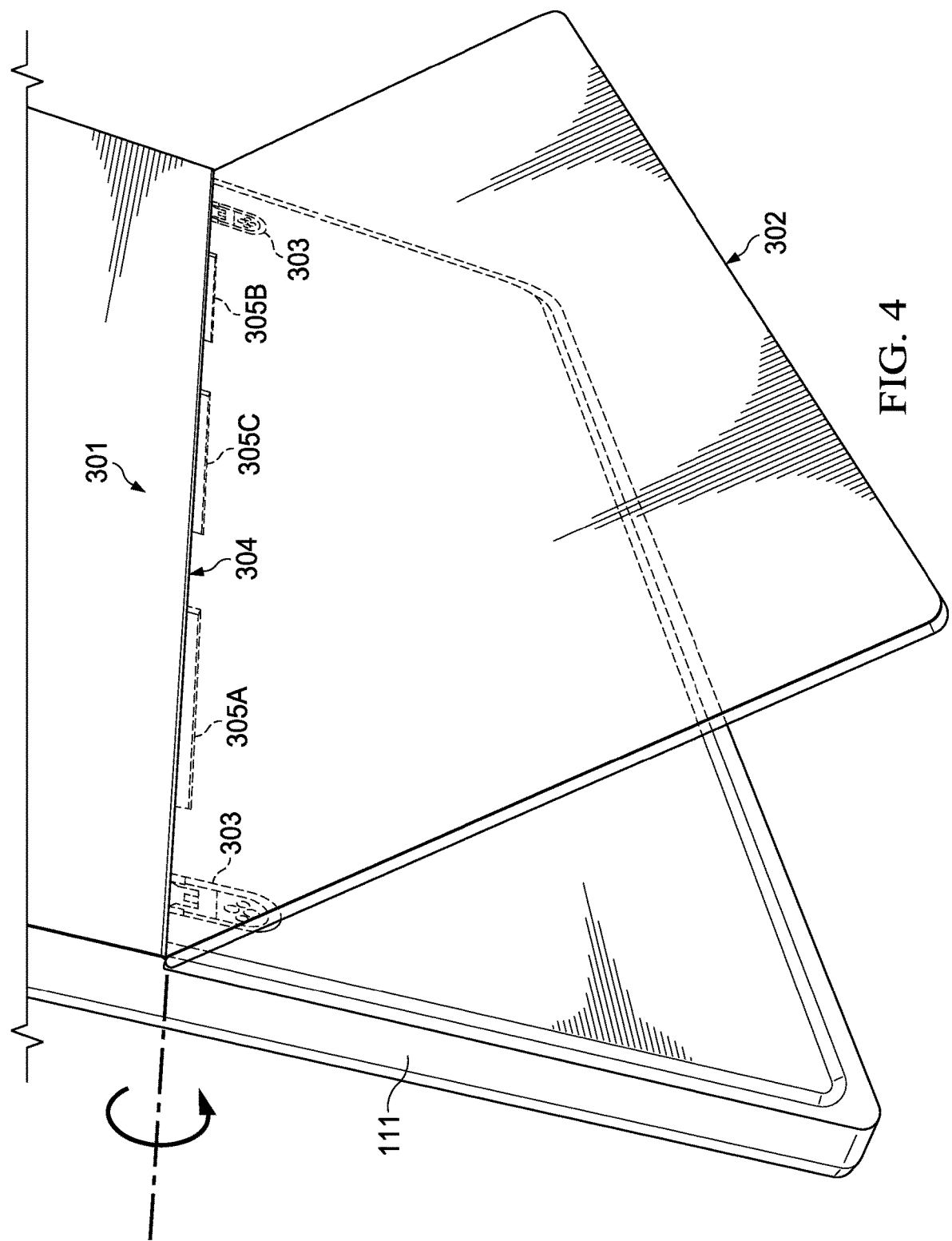
FIG. 4 is a diagram of an example of a housing with a kickstand in an open position, according to some embodiments.

FIGS. 3 and 4 are diagrams of examples of an IHS's housing showing kickstand 302 in different positions. Particularly, the back side of the IHS's housing (opposite display 111) includes fixed backplate 301 and kickstand 302. Kickstand 302 is coupled to backplate 301 via one or more hinges 303, such that kickstand 302 can swivel or rotate around axis 304 with respect to backplate 301 to move between its closed and open (i.e., deployed) positions.

In the closed configuration of FIG. 3, kickstand 302 is coplanar or parallel with respect to backplate 301, such that housing 200 may be placed horizontally on a flat surface (as in FIG. 2). In the open configuration of FIG. 4, kickstand 302 has been rotated away from backplate 301 around axis 304 so that it can keep the IHS's housing standing upright (at an angle) on a horizontal surface without having to lean against another object or be held by a person.

Backplate 301 may include one or more air vents 305A-C near axis 304. Vents 305A-C may be openings, gaps, slits, or holes in housing 200 that improve the IHS 100's ability to draw air from its surrounding environment, thus increasing air flow inside housing 200 and reducing the operating temperature or various IHS components. The number of air vents 305A-C, their distribution, and their position along axis 304 may be selected depending upon the physical configuration of IHS components within housing 200. In some implementations, vents 305A-C may include filters, screens, or grills to prevent foreign objects and dust from entering housing 200 without compromising airflow.

Figure 5:
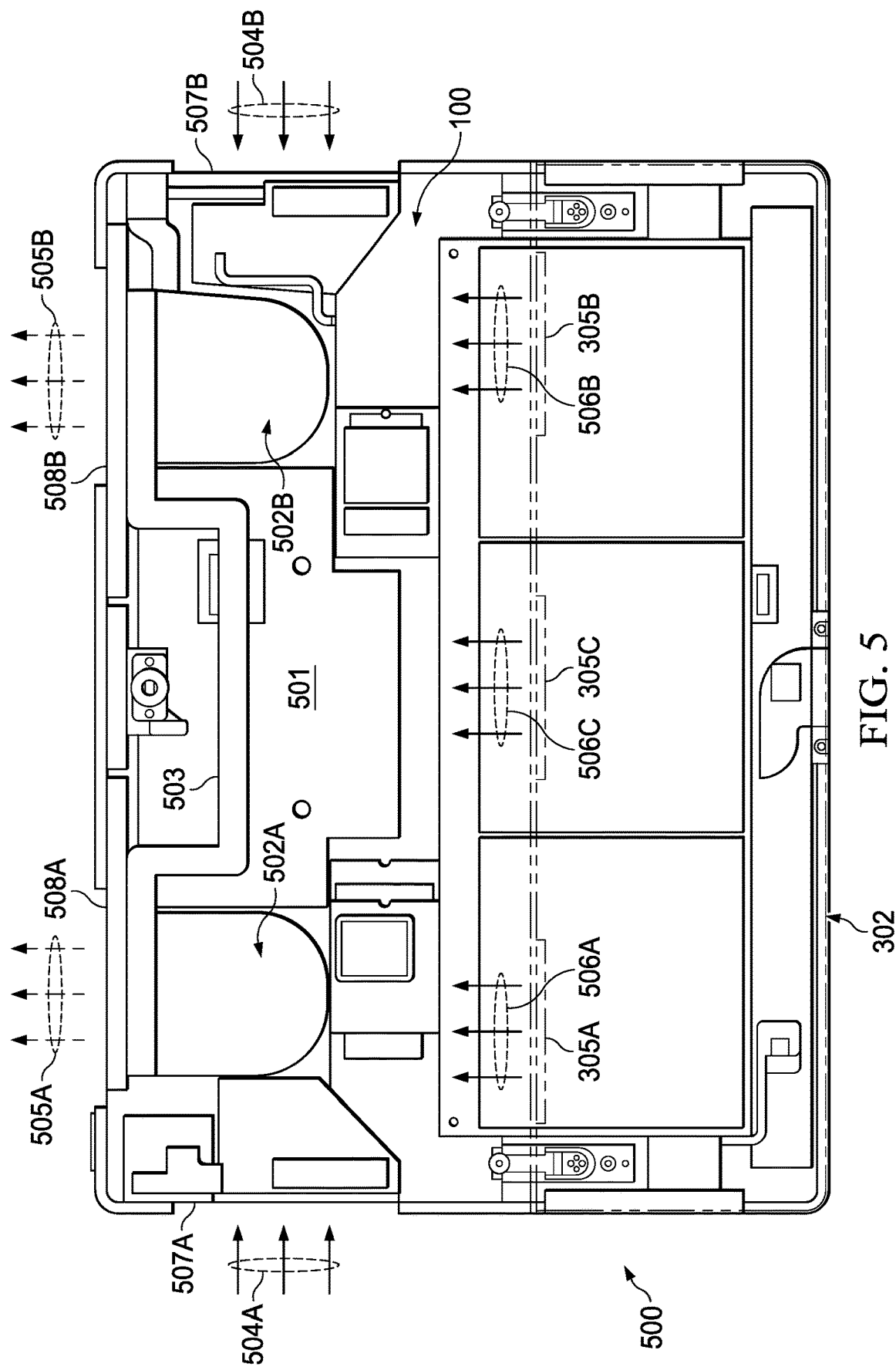
FIG. 5 is a diagram of an example of a cooling operation using vents disposed under a kickstand, according to some embodiments.

When kickstand 302 is open, vents 305A-C are operational and allow extra cool air inside housing 200, for example, as drawn by one or more fans (e.g., 502A and 502B in FIG. 5). When kickstand 302 is closed, however, vents 305A-C are blocked and IHS 100 may instead rely upon other vents (e.g., lateral vents 504A and 504B) to keep the interior of housing 200 below a selected temperature.

In various embodiments, backplate 301 and/or kickstand 302 may be made of a metal or metallic alloy or material, similar to the rest of housing 200. Additionally, or alternatively, backplate 301 and/or kickstand 302 may be a plastic material or compound, such as, for example: Acrylonitrile Butadiene Styrene (ABS), High-density Polyethylene (HDPE), Polyether Ether Ketone (PEEK), polyamide (Nylon), polycarbonate (PC), polyethylene (PE), polyetherimide (PEI), polybutylene terephthalate (PBTR), polyoxymethylene (POM), polypropylene (PP), polypropiolactone (PPL), polyvinyl chloride (PVC), thermoplastics, etc. Alternatively, backplate 301 and/or kickstand 302 may be made of acrylic, silicone, glass, ceramic, etc.

FIG. 5 is a diagram of an example of cooling operation 500 using air vents disposed under kickstand 302. In this implementation, IHS 100 includes fans 502A and 502B symmetrically disposed around center region 501 of IHS 100. Center region 501 includes heat pipe or heat sink 503 coupled to the heat exchanging elements of fans 502A and 502B.

When kickstand 302 is closed, as shown in FIG. 3, lateral vents 507A and 507B may receive cool air 504A and 504B, respectively, and front vents 508A and 508B may output hot air 505A and 505B. Vents 305A-C are blocked by kickstand 302 and therefore do not allow a significant amount of cool air to enter the IHS housing.

When kickstand 302 is open or deployed, as shown in FIG. 4, lateral vents 507A and 507B still receive cool air 504A and 504B and front vents 508A and 508B continue to output hot air 505A and 505B. Furthermore, vents 305A-C now allow additional cool air 506A-C to flow into the IHS housing. Additional cool air 506A and 506B from vents 305A and 305B reaches fans 502A and 502B, respectively, and additional cool air 506C from vent 305C creates a partial radial airflow around heat pipe or heat sink 503.

In some embodiments, when kickstand 302 is open, increased airflow 506A-C due to vents 305A-C being unobstructed may allow IHS 100 to enter a high-performance mode whereby its components (e.g., processor(s) 101) are allowed to operate with greater frequencies, voltages, currents, speed, turbo, etc., thus reaching higher temperatures. Additionally, or alternatively, increased airflow 506A-C provided when vents 305A-C are unobstructed by kickstand 302 may allow IHS 100 to enter a quiet mode of operation with slower fan speeds and less noise or vibration. In some cases, the position of kickstand 302 (e.g., open or closed) may be used to control a mode of operation of IHS 100.

Figure 6:
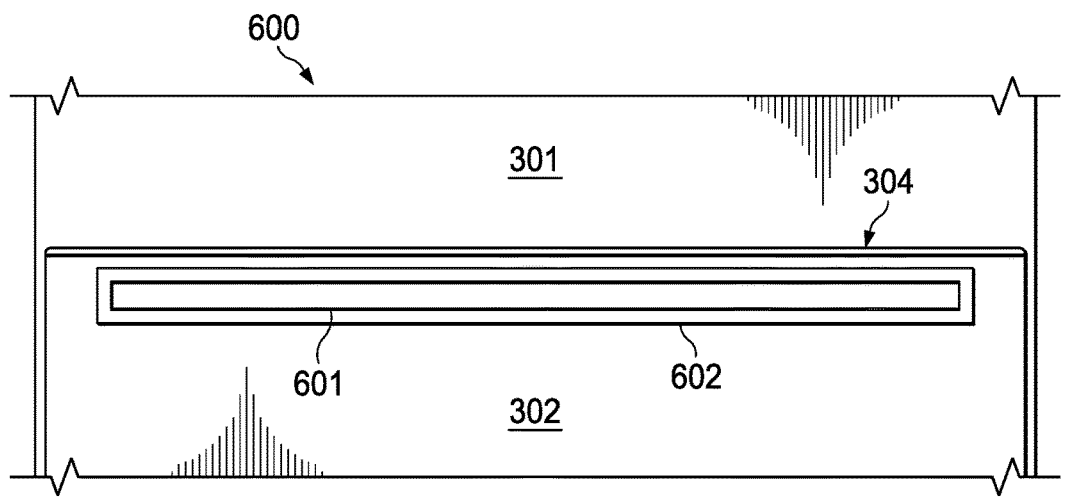
FIGS. 6-8 are diagrams of examples of various vent and kickstand opening combinations, according to some embodiments.
Figure 7:
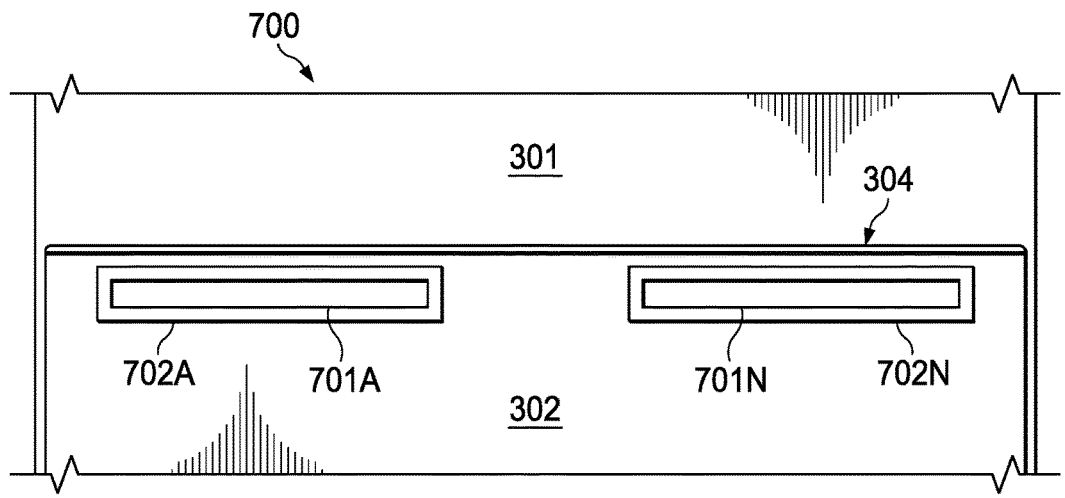
Figure 8:
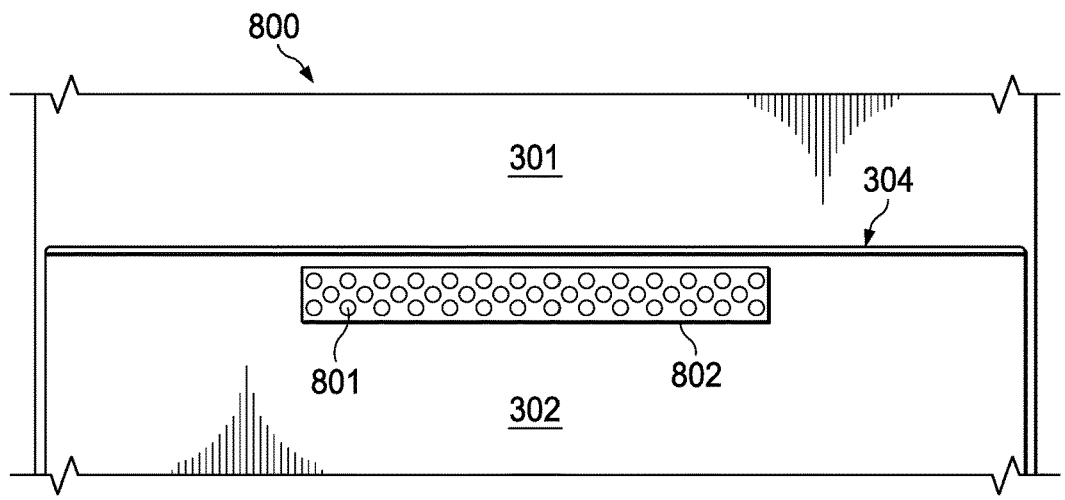

FIGS. 6-8 are diagrams of examples of vent and kickstand opening combinations 600-800. In combination 600, backplate 301 includes rectangular opening 601 having its long sides parallel to axis 304. In some cases, kickstand 302 may include rectangular opening 602 coextensive with, or larger than, opening 601. Opening 602 may be co-located with respect to opening 601 when kickstand 302 is in a closed configuration. In this manner, the additional airflow afforded by vent 601 may be present even when kickstand 302 is closed.

In combination 700, backplate 301 includes two or more discrete rectangular openings 701A and 701B having their long sides parallel to axis 304. In some cases, kickstand 302 may include rectangular openings 702A and 702B coextensive with, or larger than, openings 701A and 701B. Openings 702A and 702B may be co-located with respect to openings 701A and 701B when kickstand 302 is in a closed configuration. In this manner, the additional airflow afforded by vents 701A and 701B may be present even when kickstand 302 is closed.

In combination 800, backplate 301 includes perforated holes 801 disposed along axis 304. In some cases, kickstand 302 may include rectangular opening 802 coextensive with holes 801. Opening 802 may be co-located with respect to holes 801 when kickstand 302 is in a closed configuration. In this manner, the additional airflow afforded by vents 801 may be present even when kickstand 302 is closed.

Figure 9:
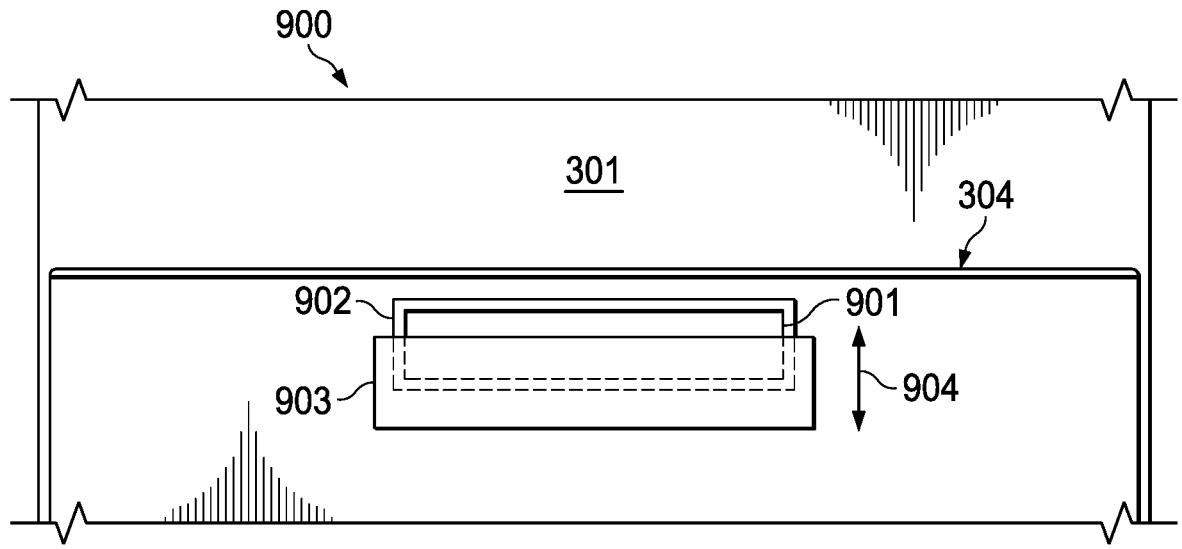
FIGS. 9 and 10 are diagrams of examples of partial kickstand opening implementations, according to some embodiments.
Figure 10:
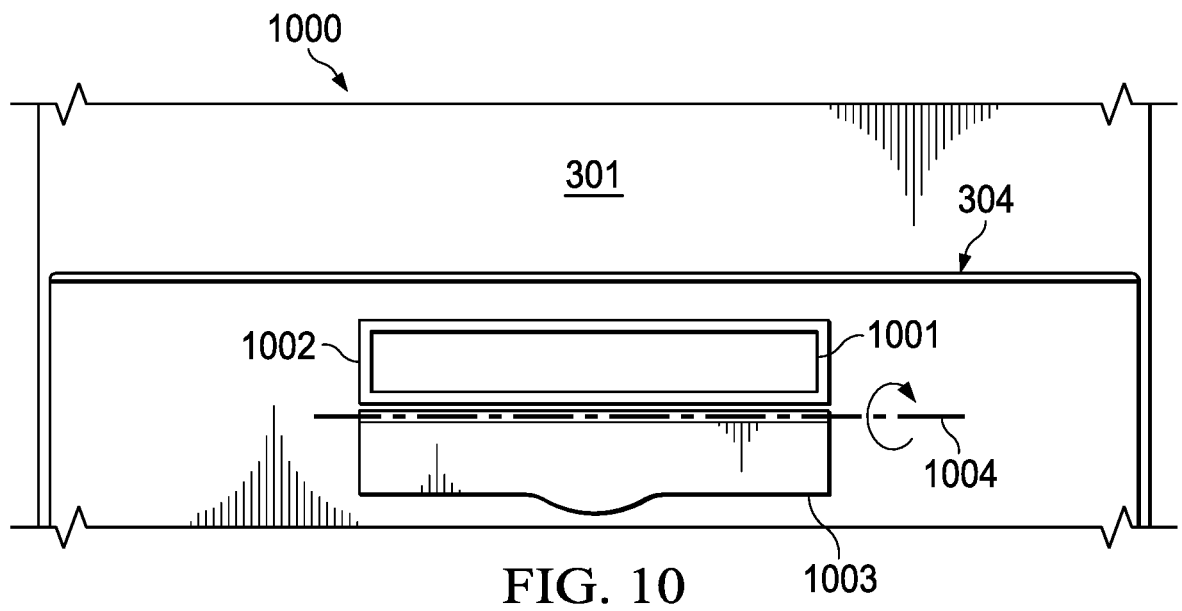

FIGS. 9 and 10 are diagrams of examples of partial kickstand opening implementations. Particularly, in FIG. 9, window portion 903 slides up and down in direction 904 to cover or uncover opening 902 overlying housing vent 901 on backplate 301 when kickstand 302 is closed. In FIG. 10, window portion 1003 flips open and closed around axis 1004 to cover or uncover opening 1002 overlying housing vent 1001 on backplate 301 when kickstand 302 is closed. As such, vents 901 and 1001 may be located under kickstand 302 when at least a portion of the kickstand (e.g., other than window portions 903 or 1003) is in a closed position. Even when kickstand 302 is closed, however, window portions 903 and 1003 may be opened to allow airflow through vents 901 and 1001.

In some embodiments, systems and methods described herein may reduce an IHS housing's skin temperature by 1.4° C. or more. Additionally, or alternatively, these systems and methods may provide a 6% boost or greater in an IHS's thermal design power (TDP), which means the IHS can run cooler at higher TDPs. Additionally, or alternatively, these systems and methods may enable the design of thinner IHS housings.

In many implementations, systems and methods described herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, wearable devices, IoT devices, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Reference is made herein to "configuring" a device or a device "configured to" perform some operation(s). It should be understood that this may include selecting predefined logic blocks and logically associating them. It may also include programming computer software-based logic of a retrofit control device, wiring discrete hardware components, or a combination of thereof. Such configured devices are physically designed to perform the specified operation(s).

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

The invention claimed is:

1. An Information Handling System (IHS), comprising:
   a plurality of components; and
   a housing configured to hold the plurality of components, wherein the housing comprises a backplate comprising a vent, wherein at least a portion of the backplate is located under a kickstand when at least a portion of the kickstand is in a closed position, wherein the vent comprises at least one rectangular opening, wherein the kickstand comprises a kickstand opening coextensive with, or larger than, the at least one rectangular opening of the vent, and wherein the kickstand opening is co-located with respect to the at least one rectangular opening of the vent when the kickstand is in the closed position.

2. The IHS of claim 1, wherein the housing has a tablet, smartphone, or laptop form factor.

3. The IHS of claim 1, wherein a long side of the at least one rectangular opening of the vent is disposed perpendicular to a lateral vent of the housing.

4. The IHS of claim 1, wherein the vent comprises a plurality of openings.

5. The IHS of claim 1, wherein the long side of the at least one rectangular opening of the vent is disposed parallel to an axis of rotation of the kickstand.

6. The IHS of claim 1, wherein the vent is configured to increase air intake by a fan of the IHS when the kickstand is in an open position.

7. The IHS of claim 6, wherein the housing further comprises a second vent located under the kickstand when the kickstand is in the closed position.

8. The IHS of claim 7, wherein the second vent is configured to increase air intake by a second fan of the IHS when the kickstand is in the open position.

9. The IHS of claim 8, wherein the housing comprises a third vent configured to increase airflow through a center of the housing when the kickstand is in the open position.

10. The IHS of claim 8, wherein the housing comprises a third vent configured to increase airflow around a heat pipe or heat sink of the IHS when the kickstand is in the open position.

11. A housing, comprising:
    a backplate having a vent configured to facilitate cooling of an Information Handling System (IHS) disposed in the housing, wherein the vent comprises at least one rectangular opening; and
    a kickstand coupled to the backplate, wherein the kickstand is configured to cover at least a portion of the backplate in a closed position and to uncover the vent in an open position, wherein the kickstand comprises a kickstand opening coextensive with, or larger than, the at least one rectangular opening of the vent, and wherein the kickstand opening is co-located with respect to the at least one rectangular opening of the vent when the kickstand is in the closed position.

12. The housing of claim 11, wherein the at least one rectangular opening of the vent is disposed parallel to a hinge coupled to the kickstand.

13. The housing of claim 11, wherein the vent is configured to provide additional air intake to a fan when the kickstand is in the open position.

14. The housing of claim 11, wherein the long side of the at least one rectangular opening of the vent is disposed parallel to an axis of rotation of the kickstand.

15. A method, comprising:
  reducing airflow configured to cool an Information Handling System (IHS) component by closing a kickstand against a backplate of an IHS housing, wherein the kickstand is configured to cover at least a portion of the backplate when closed, and to uncover a vent of the backplate when open, wherein the vent comprises at least one rectangular opening, wherein the kickstand comprises a kickstand opening coextensive with, or larger than, the at least one rectangular opening of the vent, and wherein the kickstand opening is co-located with respect to the at least one rectangular opening of the vent when the kickstand is closed; and
  increasing the airflow by opening the kickstand.

16. The method of claim 15, wherein closing and opening the kickstand comprise rotating the kickstand with respect to the backplate.

17. The method of claim 15, wherein the kickstand is configured to cover another vent in the IHS housing when closed, and to uncover the other vent when open.

18. The method of claim 15, wherein the long side of the at least one rectangular opening of the vent is disposed parallel to an axis of rotation of the kickstand.

\* \* \* \* \*

UNITED STATES PATENT AND TRADEMARK OFFICE
CERTIFICATE OF CORRECTION

PATENT NO. : 11,910,548 B2
APPLICATION NO. : 17/653728
DATED : February 20, 2024
INVENTOR(S) : Allen B. McKittrick, Pomin Shih and Deeder M. Aurongzeb It is certified that error appears in the above-identified patent and that said Letters Patent is hereby corrected as shown below:

In the Claims

In Column 8 Lines 13 and 14, Claim 1, delete "located under a kickstand when at least a portion of the kickstand is in a closed position, wherein the vent" and insert --located under a kickstand when the kickstand is in a closed position, wherein the vent-- therefor.

Signed and Sealed this
Twenty-sixth Day of March, 2024

Katherine Kelly Vidal
*Director of the United States Patent and Trademark Office*